United States Patent
Chi

(10) Patent No.: US 6,174,770 B1
(45) Date of Patent: Jan. 16, 2001

(54) METHOD FOR FORMING A CROWN CAPACITOR HAVING HSG FOR DRAM MEMORY

(75) Inventor: Min-hwa Chi, Hsinchu (TW)

(73) Assignee: Taiwan Semiconductor Manufacturing Co., Ltd., Hsin-Chu (TW)

(*) Notice: Under 35 U.S.C. 154(b), the term of this patent shall be extended for 0 days.

(21) Appl. No.: 09/419,402

(22) Filed: Oct. 14, 1999

(51) Int. Cl.⁷ .............................................. H01L 21/8242
(52) U.S. Cl. ........................................ 438/255; 438/398
(58) Field of Search ................................. 438/253–256, 438/396–399

(56) References Cited

U.S. PATENT DOCUMENTS 6,010,942 * 1/2000 Chien et al. ........................... 438/396
6,046,083 * 4/2000 Lin et al. .............................. 438/255

* cited by examiner

*Primary Examiner*—Jey Tsai
(74) *Attorney, Agent, or Firm*—Blakley, Sokoloff, Taylor & Zafman LLP

(57) ABSTRACT

A method for manufacturing a semiconductor capacitor atop a conductive plug that is formed in a dielectric layer. A first oxide layer is formed on the dielectric layer and the conductive plug. Next, a crown opening in formed in the first oxide layer such that the conductive plug is exposed. Silicon sidewall spacers are formed on the sidewalls of the crown opening and then HSG silicon is formed on the silicon sidewall spacers. The HSG silicon and silicon sidewall spacers are oxidized and then a doped polysilicon layer is formed into the aid crown opening and over the oxidized HSG silicon. A thin dielectric layer is formed over the aid doped polysilicon layer and finally a top conductive layer is formed over the thin dielectric layer.

9 Claims, 3 Drawing Sheets

METHOD FOR FORMING A CROWN CAPACITOR HAVING HSG FOR DRAM MEMORY

FIELD OF THE INVENTION

This invention relates to semiconductor memories, and more particularly, to an improved method for making a DRAM capacitor.

BACKGROUND OF THE INVENTION

It has been a recent trend in dynamic random access memory (DRAM) to increase the density of DRAM integrated circuits. However, as higher density DRAM cells are developed, the area available for capacitors that are used in the DRAM cells decreases. In order to decrease the area of capacitors while maintaining reliability standards, it is important to be able to maintain the capacitance of each capacitor while decreasing its area. Recently, capacitors having a three-dimensional structure have been suggested to increase cell capacitance. Such capacitors include, for example, double-stacked, fin-structured, cylindrical, spread-stacked, and box structured capacitors. In addition, where a polysilicon storage node is used, capacitance can be increased by selectively forming hemispherical grain polysilicon (HSG) on the polysilicon layer.

One of the most popular types of capacitors is the crown capacitor that incorporates HSG formation on the crown portion of the polysilicon. A typical prior art process flow for forming a HSG enhanced crown capacitor involves the formation of a polysilicon plug extending down through an oxide layer and nitride layer to a contact of a transistor. A second oxide layer is then deposited over the polysilicon plug and the nitride layer. Using conventional photolithography and etching steps, a crown shaped opening is formed in the second oxide layer and nitride layer. An amorphous silicon layer is then deposited over the second oxide layer and into the crown opening. The portion of the amorphous silicon layer that is outside of the crown opening is removed by, for example, chemical mechanical polishing (CMP). Next, selective HSG polysilicon is then grown on the amorphous silicon layer to form the bottom plate of the capacitor. Alternatively, the second oxide layer may be removed prior to formation of the HSG polysilicon. This allows HSG polysilicon to be formed on both the inside and outside of the crown structure.

However, the process for forming HSG polysilicon requires precise control of temperature, pressure, and doping level, which often results in large polysilicon depletion (≈15% or larger). The depletion effect reduces the capacitance and results in smaller signal charge storage.

The present invention is directed to an improved method for forming a DRAM crown capacitor using HSG polysilicon.

SUMMARY OF THE INVENTION

A method for manufacturing a semiconductor capacitor atop a conductive plug is disclosed. The conductive plug is formed in a dielectric layer. The method comprises the steps of: forming a first oxide layer on said dielectric layer and said conductive plug; forming a crown opening in said first oxide layer, said crown opening exposing said conductive plug; forming silicon sidewall spacers on the sidewalls of said crown opening; forming HSG silicon on said silicon sidewall spacers; oxidizing said HSG silicon and said silicon sidewall spacers; forming a doped polysilicon layer into said crown opening and over said oxidized HSG silicon; forming a thin dielectric layer over said doped polysilicon layer; and forming a top conductive layer over said thin dielectric layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
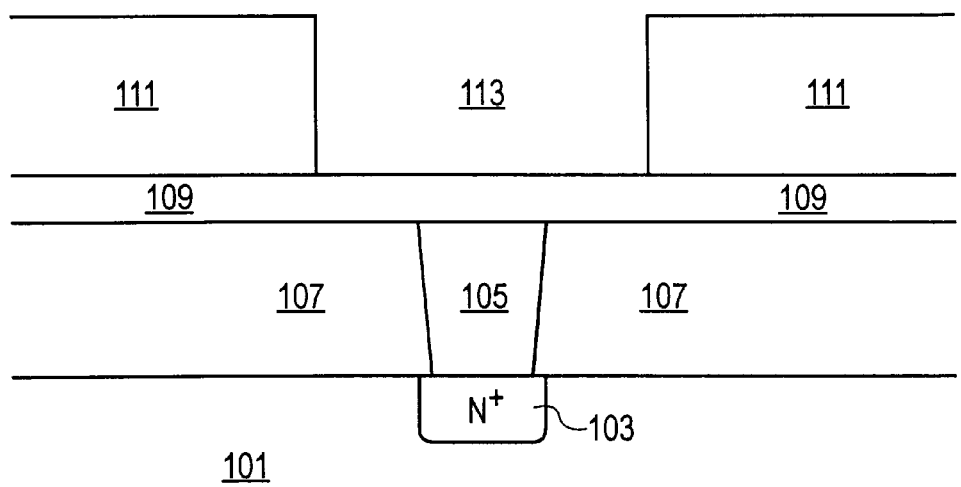
FIGS. 1–4 are cross-sectional views of a semiconductor substrate illustrating the steps of the present invention for forming a crown capacitor having HSG polysilicon.

Turning to FIG. 1, a polysilicon plug 105 extending down to an n+contact 103 of a transistor (not shown) formed in a substrate 101 is formed through a first oxide layer 107. The first oxide layer 107 may be a composite of multiple oxide layers, but typically, the total height of the polysilicon plug 105 is on the order of 10 k–15 k angstroms.

After the polysilicon plug 105 is formed, a thin silicon nitride layer 109 is formed over the first oxide layer 107 and polysilicon plug 105. The thin nitride layer 109 is used as an etching stop during later process steps. The thin nitride layer 109 is preferably 100–300 angstroms thick.

A second oxide layer 111 is then deposited over the polysilicon plug 111 and the first nitride layer 109. The second oxide layer 111 is preferably 5000–7000 angstroms thick and can be any commonly used oxide, such as BPSG, TEOS, spin-on-glass, or silicon dioxide. Next, using conventional photolithography and etching steps, a crown shaped opening 113 is formed in the second oxide layer 111. The resulting structure is shown in FIG. 1.

Figure 2:
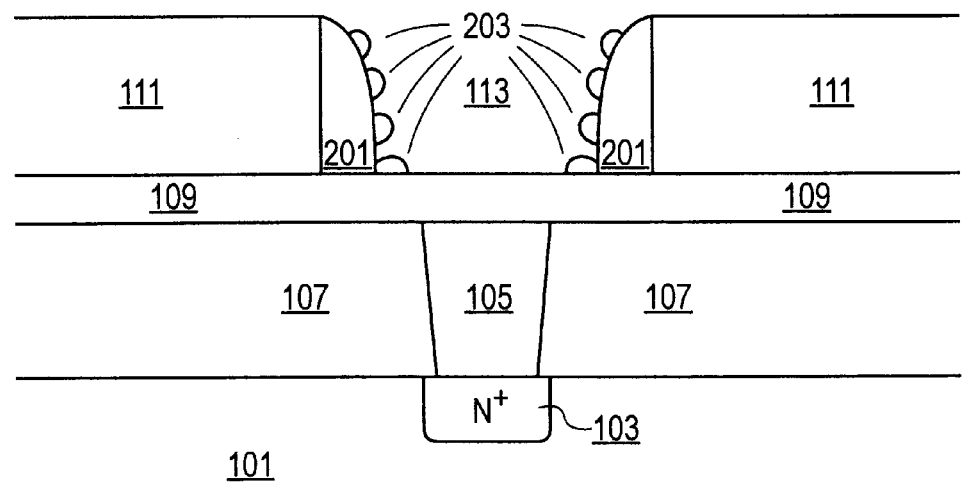

Next, turning to FIG. 2, an amorphous silicon layer of about 500 angstroms thickness is then deposited over the second oxide layer 111 and into the crown opening 113. The amorphous silicon layer is then etched back to form thin sidewall spacers 201 on the sidewalls of the crown opening 113. Alternatively, the amorphous silicon layer may be replaced with a polysilicon layer.

Next, HSG silicon 203 is formed on the amorphous silicon sidewall spacers 201 surface using either the seeding technique or the high-vacuum annealing technique. See Watanabe et al., "An Advanced Technique for Fabricating Hemispherical-Grain (HSG) Silicon Storage Electrodes", IEEE Transactions on Electron Devices, Vol. 42, No. 2, February 1995 and Watanabe et al., "Hemispherical Grained Si Formation on in-situ Phosphorus Doped Amorphous-Si Electrode for 256Mb DRAM's Capacitor", IEEE Transactions on Electron Devices, Vol. 42, No. 7, July 1995. After the HSG nodules are formed, the sidewall spacer becomes thinner due to the silicon atoms moving into the HSG silicon modules 203.

Note that it is known that HSG silicon is most easily formed on a amorphous silicon surface, less easily on a silicon nitride surface, and most difficult on an oxide surface. Thus, one optional step is the formation of a thin oxide layer over the thin nitride layer 109 to prevent HSG silicon from being formed on the thin nitride layer 109. Note that the density and size of the HSG silicon nodules can be controlled by process parameters (i.e. doping level of the amorphous silicon, thickness of silicon amorphous layers, deposition time, temperature, silane flow, pressure, etc . . . )

Once the HSG silicon nodules have been formed, the next step is the complete oxidation of the amorphous silicon sidewall spacers 201 and the HSG silicon nodules 203. The oxidation is preferably performed by thermal oxidation in an oxygen ambient (i.e. oxygen or steam). The oxidation of the HSG silicon nodules 203 results in a roughened surface due to volume expansion during the oxidation. After the oxidation of the amorphous silicon spacers 201 and the HSG silicon nodules 203, the resulting structure is seen in FIG. 2.

Figure 3:
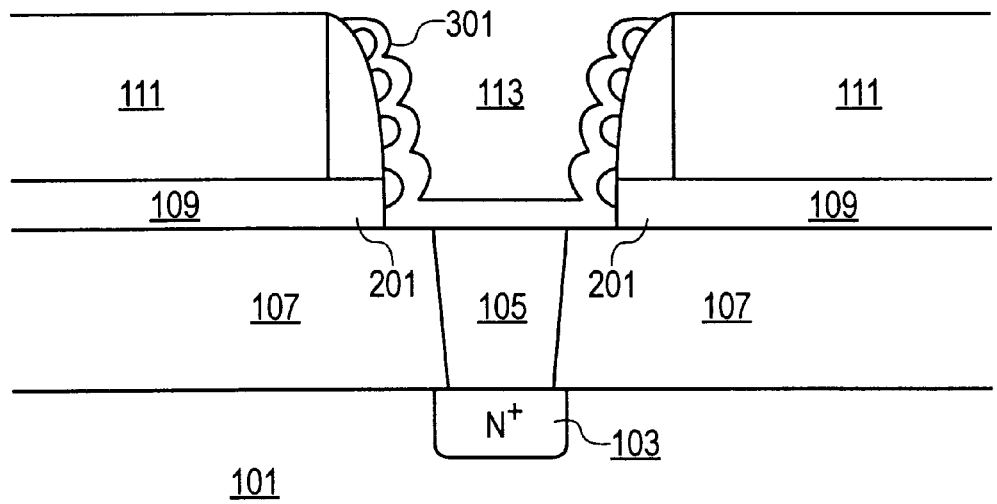

Next, turning to FIG. 3, an anisotropic oxide/nitride plasma etch is performed in order to expose the top of the polysilicon plug 105. After the bottom of the crown opening 113 is exposed, a heavily in-situ doped layer of polysilicon 301 is deposited to about a thickness of 1000–2000 angstroms. The portion of the polysilicon layer 301 that is outside of the crown opening 113 is removed by, for example, chemical mechanical polishing (CMP) until the second oxide layer 111 is reached.

Note that the deposited polysilicon layer 301 is conformal to the sidewalls of the crown opening 113, which have been roughened by the fully oxidized HSG silicon nodules 203. Thus, the bottom storage node (formed by the polysilicon layer 301) has a much expanded surface area due to the roughness of the sidewalls of the crown opening 113.

Figure 4:
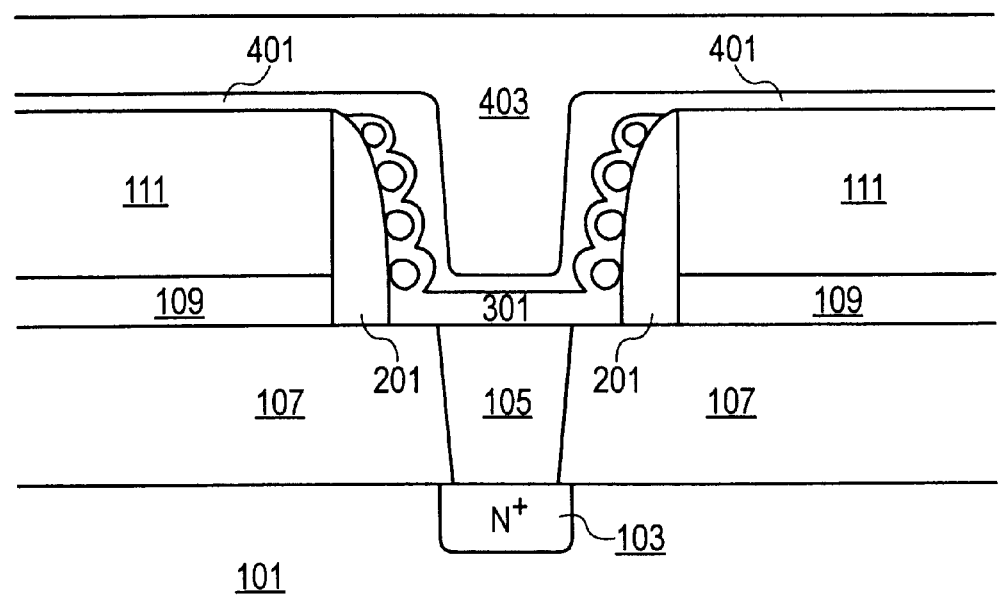

Turning to FIG. 4, a dielectric film 401, preferably nitride/oxide or oxide/nitride/oxide is deposited over the second oxide layer 111 and the polysilicon layer 301. The dielectric film 401 is very thin and is not drawn to scale in FIG. 4 in the interest of clarity. Finally, a top plate polysilicon layer 403 is formed over the dielectric film 401 to complete the formation of the capacitor.

Note that conventional HSG silicon formation on a silicon surface is sensitive to the surface doping level and requires precise control of process parameters. In contrast, the present invention is based on HSG formation on amorphous silicon surface followed by full oxidation into oxide nodules. Heavily doped poly is then deposited as a replica of the roughened surface. In this way, the dependence of HSG formation on poly doping level is decoupled from the poly electrode doping.

Figure 5:
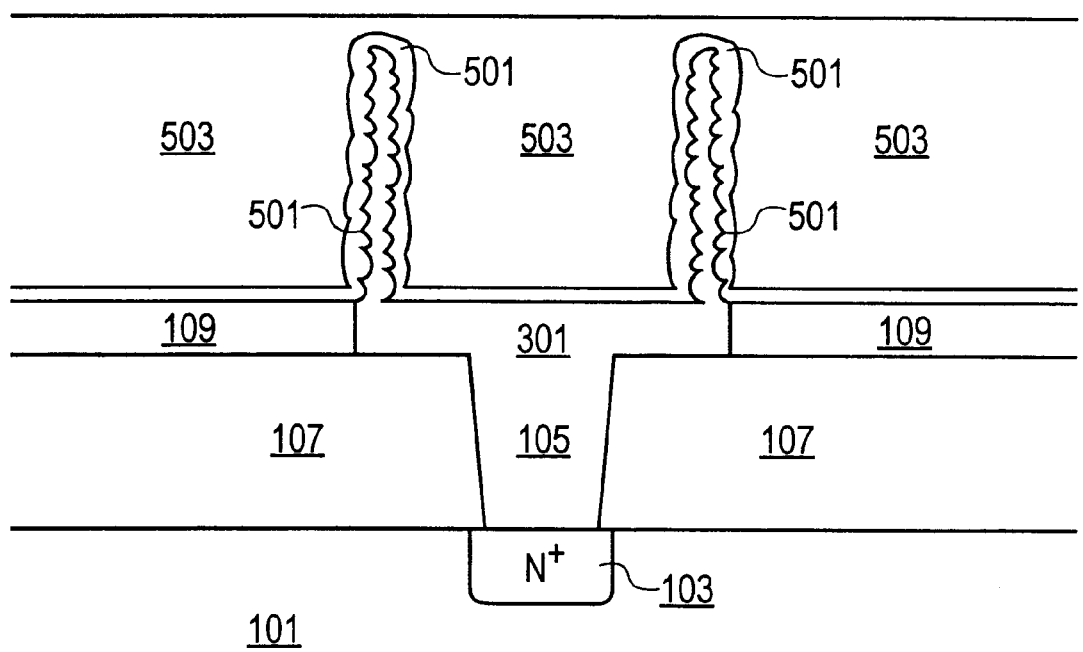
FIG. 5 is a cross-sectional views of a semiconductor substrate illustrating the step of an alternative embodiment of the present invention for forming a DRAM capacitor.

An alternative embodiment of the present invention is shown in FIG. 5. In this embodiment, the outer surface of the bottom storage node is also in capacitance relationship with the top plate. Specifically, in this embodiment, the same steps up through FIG. 3 are performed as in the preferred embodiment. At FIG. 3, the second oxide layer 111 is removed using a wet etch, for example, using a dilute HF solution or a HF vapor etching process. Note that the thin nitride layer 109 acts as an etching stop. In addition, the polysilicon layer 301 remains standing upright to form the bottom storage node of the crown capacitor. Note that the outer surface of the polysilicon layer 301 has the same roughness as the inner surface of the polysilicon layer 301.

Next, a dielectric film 501, preferably nitride/oxide or oxide/nitride/oxide is deposited over the thin nitride layer 109 and the polysilicon layer 301. The dielectric film 501 is very thin and is not drawn to scale in FIG. 5 in the interest of clarity. Finally, a top plate polysilicon layer 503 is formed over the dielectric film 501 to complete the formation of the capacitor.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for manufacturing a semiconductor capacitor atop a conductive plug, said conductive plug being formed in a dielectric layer, the method comprising the steps of:

forming a first oxide layer on said dielectric layer and said conductive plug;

forming a crown opening in said first oxide layer, said crown opening exposing said conductive plug;

forming silicon sidewall spacers on the sidewalls of said crown opening;

forming HSG silicon on said silicon sidewall spacers;

oxidizing said HSG silicon and said silicon sidewall spacers;

forming a doped polysilicon layer into said crown opening and over said oxidized HSG silicon;

forming a thin dielectric layer over said doped polysilicon layer; and forming a top conductive layer over said thin dielectric layer.

2. The method of claim 1 further including the step of removing said oxidized HSG silicon and said first oxide layer after said polysilicon layer is formed.

3. The method of claim 1 wherein said conductive plug and said top conductive layer are formed from polysilicon.

4. The method of claim 1 wherein said sidewall spacers are formed from amorphous silicon.

5. A method for manufacturing a semiconductor capacitor atop a conductive plug, said conductive plug being formed in a dielectric layer, the method comprising the steps of:

forming a thin nitride layer on said dielectric layer;

forming a first oxide layer on said thin nitride layer and said conductive plug;

forming a crown opening in said first oxide layer;

forming silicon sidewall spacers on the sidewalls of said crown opening;

forming HSG silicon on said silicon sidewall spacers;

oxidizing said HSG silicon and said silicon sidewall spacers;

etching through said thin nitride layer to expose said conducting plug;

forming a doped polysilicon layer into said crown opening and over said oxidized HSG silicon;

forming a thin dielectric layer over said doped polysilicon layer; and forming a top conductive layer over said thin dielectric layer.

6. The method of claim 5 further including the step of removing said oxidized HSG silicon and said first oxide layer after said polysilicon layer is formed.

7. The method of claim 5 wherein said conductive plug and said top conductive layer are formed from polysilicon.

8. The method of claim 5 wherein said sidewall spacers are formed from amorphous silicon.

9. The method of claim 5 further including the step of forming a thin oxide layer over said thin nitride layer before the step of forming said HSG silicon.

\* \* \* \* \*